(12) United States Patent
Brause et al.

(10) Patent No.: US 9,836,097 B2
(45) Date of Patent: Dec. 5, 2017

(54) STORAGE DRIVE AND STORAGE DRIVE BLOCK

(71) Applicant: HGST Netherlands B.V., Amsterdam (NL)

(72) Inventors: David D. Brause, Longmont, CO (US); Dana C. Fisher, Berthoud, CO (US); Brian L. Rappel, Lyons, CO (US)

(73) Assignee: Western Digital Technologies, Inc., Irvine, CA (US)

( * ) Notice: Subject to any disclaimer, the term of this patent is extended or adjusted under 35 U.S.C. 154(b) by 70 days.

(21) Appl. No.: 14/482,487

(22) Filed: Sep. 10, 2014

(65) Prior Publication Data

US 2016/0070295 A1    Mar. 10, 2016

(51) Int. Cl.
| | |
|---|---|
| *G06F 1/16* | (2006.01) |
| *G06F 1/18* | (2006.01) |
| *G11B 33/12* | (2006.01) |
| *G11B 33/08* | (2006.01) |
| *H05K 5/00* | (2006.01) |
| *G06F 1/20* | (2006.01) |

(52) U.S. Cl.
CPC ............. *G06F 1/187* (2013.01); *G06F 1/20* (2013.01); *G11B 33/08* (2013.01); *G11B 33/128* (2013.01); *H05K 5/0021* (2013.01)

(58) Field of Classification Search
CPC ....... G06F 1/187; G11B 33/08; G11B 33/125; G11B 33/128; H05K 5/0021; H05K 5/1417

USPC .................................. 361/679.33–679.39
See application file for complete search history.

(56) References Cited

U.S. PATENT DOCUMENTS

| | | | |
|---|---|---|---|
| 5,212,681 A | 5/1993 | Bock et al. | |
| 5,251,106 A * | 10/1993 | Hui ..................... | H05K 5/0021 206/508 |
| 5,510,955 A * | 4/1996 | Taesang ............... | H05K 7/1411 361/679.31 |
| 5,544,969 A * | 8/1996 | Ammon ............... | H05K 5/0021 220/23.4 |
| 5,788,347 A * | 8/1998 | Rabinovitz ......... | A47B 87/0215 312/111 |
| 5,992,953 A * | 11/1999 | Rabinovitz ............ | A47B 87/02 312/111 |
| 6,234,591 B1 | 5/2001 | Driscoll et al. | |
| 6,809,916 B2 * | 10/2004 | Nakata ..................... | F16F 1/025 361/115 |
| 7,167,359 B2 * | 1/2007 | Wendel ................ | G11B 33/128 211/41.17 |
| 7,187,543 B2 | 3/2007 | Zimlin | |
| 7,715,182 B2 | 5/2010 | Signer et al. | |
| 8,035,916 B2 * | 10/2011 | Marlow ............... | G11B 25/043 360/97.19 |
| 8,369,081 B2 | 2/2013 | Chen | |

(Continued)

Primary Examiner — Nidhi Thaker (57) ABSTRACT

A storage drive configured for use in a storage drive block and a storage drive block are provided. The storage drive block in one example includes a plurality of storage drives joined together into a substantially rigid storage drive block, a block communication element extending to the plurality of storage drives and adapted to communicatively link a plurality of communication boards of the plurality of storage drives to a mass storage chassis assembly, and one or more joining elements affixing the one or more mounting elements of each storage drive to form the storage drive block.

17 Claims, 8 Drawing Sheets

(56) References Cited

U.S. PATENT DOCUMENTS

| | | | | |
|---|---|---|---|---|
| 8,427,822 B2* | 4/2013 | Fukuda | ............. | G11B 33/08 |
| | | | | 361/679.33 |
| 8,427,835 B2 | 4/2013 | Xu et al. | | |
| 8,553,357 B1 | 10/2013 | Sorenson et al. | | |
| 8,584,999 B2* | 11/2013 | Liu | ............. | G06F 1/187 |
| | | | | 248/222.12 |
| 2008/0030945 A1* | 2/2008 | Mojaver | ............. | G06F 1/181 |
| | | | | 361/679.33 |
| 2010/0271773 A1* | 10/2010 | Ye | ............. | G11B 33/128 |
| | | | | 361/679.33 |
| 2011/0051355 A1* | 3/2011 | Hsiao | ............. | G06F 1/187 |
| | | | | 361/679.37 |
| 2012/0175489 A1* | 7/2012 | Taylor | ............. | F16F 15/067 |
| | | | | 248/563 |
| 2013/0170129 A1* | 7/2013 | Sullivan | ............. | G06F 1/185 |
| | | | | 361/679.32 |
| 2014/0055944 A1 | 2/2014 | McCabe et al. | | |
| 2014/0151317 A1* | 6/2014 | Shih | ............. | G11B 33/022 |
| | | | | 211/126.3 |
| 2015/0173234 A1* | 6/2015 | Lee | ............. | G11B 33/128 |
| | | | | 361/679.33 |
| 2015/0313028 A1* | 10/2015 | Bell | ............. | F16F 3/12 |
| | | | | 361/679.35 |
| 2015/0316964 A1* | 11/2015 | Albert | ............. | G06F 1/187 |
| | | | | 361/679.36 |
| 2015/0380059 A1* | 12/2015 | Bell | ............. | G11B 33/128 |
| | | | | 360/97.19 |

* cited by examiner

STORAGE DRIVE AND STORAGE DRIVE BLOCK

TECHNICAL FIELD

Aspects of the disclosure are related to the field of data storage systems, and in particular, to a storage drive and a storage drive block.

TECHNICAL BACKGROUND

Mass storage systems are used for storing enormous quantities of digital data. As computer systems and networks grow in numbers and capability, there is a need for more and more storage system capacity. Cloud computing and large-scale data processing have further increased the need for digital data storage systems that are capable of transferring and holding immense amounts of data.

A mass storage chassis assembly is a modular unit that holds and operates a number of storage devices, such as Hard Disk Drives (HDDs), for example. The capacity of a mass storage system can be increased in large increments by the installation of an additional mass storage chassis assembly or assemblies to a rack or other support structure. Each storage device is independently held and isolated. Consequently, vibrations generated by an operating storage device will not be transmitted to other storage devices (or to the mass storage chassis assembly generally).

A cold storage mass storage chassis assembly stores digital data that is infrequently accessed. In a cold storage mass storage chassis assembly, only a small percentage of the storage drives may be operating at any given time.

OVERVIEW

A storage drive configured for use in a storage drive block and a storage drive block are provided. The storage drive block in one example includes a plurality of storage drives joined together into a substantially rigid storage drive block, a block communication element extending to the plurality of storage drives and adapted to communicatively link a plurality of communication boards of the plurality of storage drives to a mass storage chassis assembly, and one or more joining elements affixing the one or more mounting elements of each storage drive to form the storage drive block.

DETAILED DESCRIPTION

The following description and associated drawings teach the best mode of the invention. For the purpose of teaching inventive principles, some conventional aspects of the best mode may be simplified or omitted. The following claims specify the scope of the invention. Some aspects of the best mode may not fall within the scope of the invention as specified by the claims. Thus, those skilled in the art will appreciate variations from the best mode that fall within the scope of the invention. Those skilled in the art will appreciate that the features described below can be combined in various ways to form multiple variations of the invention. As a result, the invention is not limited to the specific examples described below, but only by claims and their equivalents.

Figure 1:
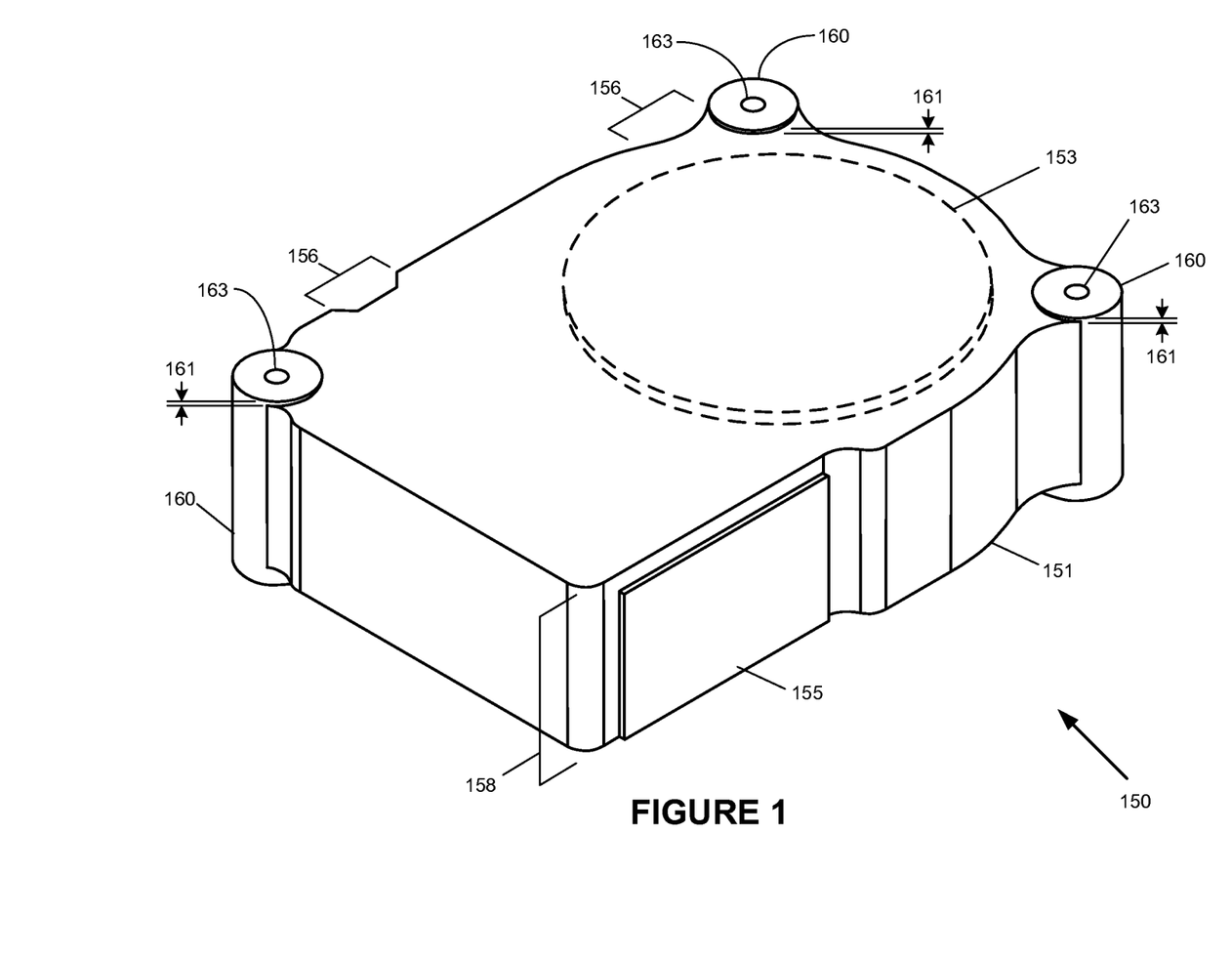
FIG. 1 shows an exemplary storage drive configured for use in a storage drive block.
Figure 4:
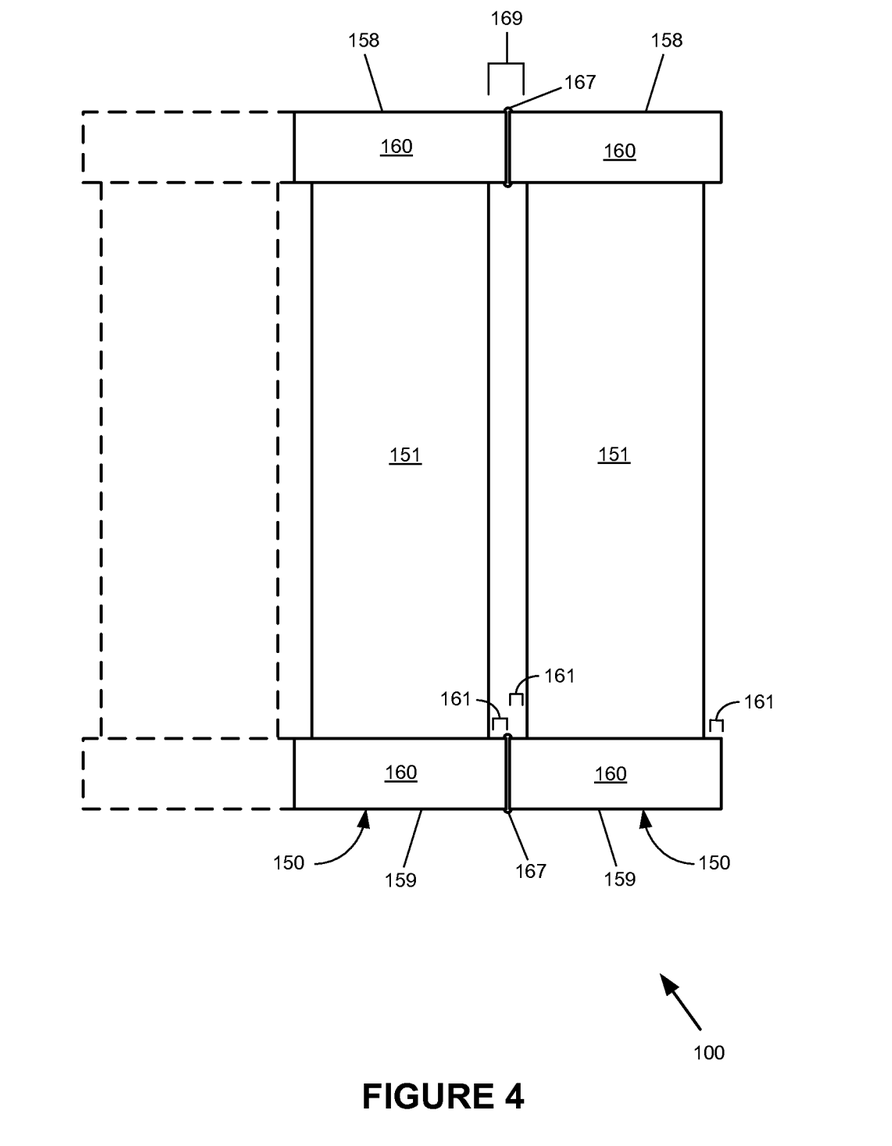
FIG. 4 shows a storage drive block comprising two or more storage devices.

FIG. 1 shows an exemplary storage drive 150 configured for use in a storage drive block 100 (see FIG. 4). The storage drive block 100 comprises a substantially rigid block that absorbs vibrations generated by a storage drive or drives 150 of the storage drive block 100. The storage drive block 100 has a combined mass that absorbs vibrations generated by an operating storage drive or drives 150 of the storage drive block 100.

The storage drive 150 comprises a digital storage device and includes one or more disk storage media 153 for storing digital information. In addition, a storage drive can comprise a hybrid storage drive comprising one or more disk storage media combined with solid-state storage media. The storage drive 150 comprises a storage drive body 151, one or more disk storage media 153 within the storage drive body 151, one or more mounting elements 160, and a communication board 155 available on an exterior of the storage drive body 151 and configured to communicate digital data to and from the one or more disk storage media 153. In some examples, the one or more mounting elements 160 can be formed as part of the storage drive body 151. In other examples, the one or more mounting elements 160 can be joined to the storage drive body 151.

The storage drive body 151 is substantially rigid in some examples. The storage drive body 151 can be formed of metal or formed of a substantially rigid plastic, fiberglass, resin, composite, or other suitable non-metallic material. The storage drive 150 includes a storage drive body 151 that is substantially rectangular in shape in some examples. The storage drive 150 includes an internal cavity or cavities for holding the one or more disk storage media 153 and associated devices and circuitry.

The communication board 155 is in electrical communication with the circuitry inside the storage drive body 151, wherein digital data is transferred into and out of the storage drive body 151 via the communication board 155. The communication board 155 in some examples is affixed to an exterior surface of the storage drive body 151. The communication board 155 of a storage drive 150 in some examples is at least partially recessed in an external surface of the storage drive body 151. In some examples, the communication board 155 is configured to receive a block communication element or elements 53 (see FIG. 8). The communication board 155 comprises or includes connector devices in some examples for linking together a plurality of storage devices 150. The connector devices couple to a block communication element or elements 53 in some examples. Alternatively, the connector devices of a particular communication board 155 directly couple to adjacent connector devices of adjacent communication boards 155.

Figure 5:
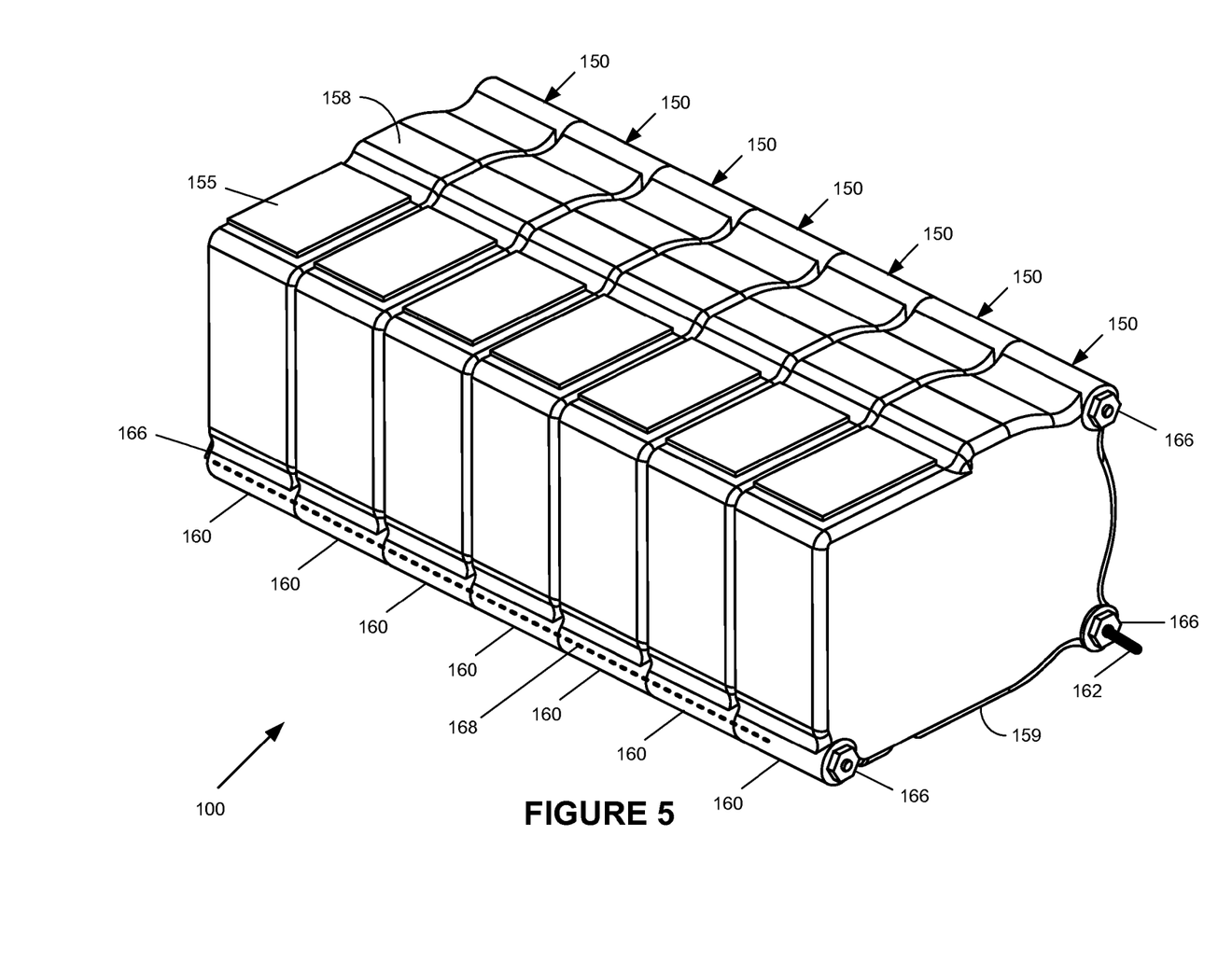
FIG. 5 shows a storage drive block for use in a mass storage chassis assembly.

The communication board 155 in some examples is affixed to an outer surface 158 of the storage drive 150. In other examples, the communication board 155 is at least partially recessed in surface 158 of the storage drive 150 or is affixed to a recessed portion of surface 158 (or other external surface of the storage drive 150). When assembled together in a storage drive block, such as found in FIG. 5, the positioning of communication board 155 allows for tight coupling of the body 151 of one or more storage drives together as discussed herein. For example, FIG. 5 shows a storage drive block with individual communication boards 155 on a "top" side of each storage drive 150 to allow each storage drive 150 to mechanically couple to each other.

The one or more mounting elements 160 are configured to couple the storage drive 150 to one or more further storage drives 150. In some examples, the one or more mounting elements 160 extend from the storage drive body 151 by a predetermined clearance distance 161 to establish a predetermined spacing gap 169 between the storage drive 150 and the one or more further storage drives (see FIG. 4). Two adjacent clearance distances 161 of two adjacent storage drives 150 are combined to create the spacing gap 169 in some examples. Alternatively, one or more spacers 167 can also be positioned between adjacent storage drives 50 in order to increase the spacing gap 169. The one or more mounting elements 160 extend from the storage drive body 151 on both the top surface 158 and the bottom surface 159 (see FIG. 2) of the storage drive body 151 in the example in the figure. Alternatively, the one or more mounting elements 160 can be substantially flush with or recessed with respect to one or both of the top surface 158 and the bottom surface 159.

The one or more mounting elements 160 can be joined to the storage drive body 151. In some examples, the one or more mounting elements 160 are formed as part of the storage drive body 151. For example, the one or more mounting elements 160 can be cast as part of the storage drive body 151 or can be machined or otherwise formed into the storage drive body 151. Alternatively, the one or more mounting elements 160 can be separately formed and then affixed to the storage drive body 151, such as by welding, soldering, or by adhesives, for example. The one or more mounting elements 160 are configured to be affixed to one or more corresponding mounting elements 160 of an adjacent storage drive or storage drives 150. The one or more mounting elements 160 are configured to join together a plurality of storage drives 150 to form a storage drive block 100 (see FIGS. 4-5, for example) and therefore are configured to be affixed together. The one or more mounting elements 160 are configured to be affixed to one or more corresponding mounting elements 160 of an adjacent storage drive or storage drives 150 by one or more joining elements 167 (see FIG. 4) or one or more fastener elements 166 (see FIG. 5). In some examples, the joining elements 167 comprise weld joints 167, solder joints 167, or bonding agent joints 167, for example. This listing is not exhaustive and other joining elements are contemplated and are within the scope of the description and claims.

In the example shown, the one or more mounting elements 160 include one or more corresponding fastener bores 163 for receiving one or more fastener elements 166. The one or more mounting elements 160 are configured to be affixed to one or more corresponding mounting elements 160 of an adjacent storage drive or storage drives 150 by one or more joining elements 167 comprising fastener elements 166 extending through substantially aligned fastener bores 163. The one or more fastener elements 166 operate to affix together the one or more mounting elements 160 and therefore affix the plurality of storage drives 150 into a substantially rigid storage drive block 100. The one or more fastener elements 166 in some embodiments comprise threaded fasteners, such as threaded rods and threaded nuts, but other fasteners are contemplated and are within the scope of the description and claims.

Figure 2:
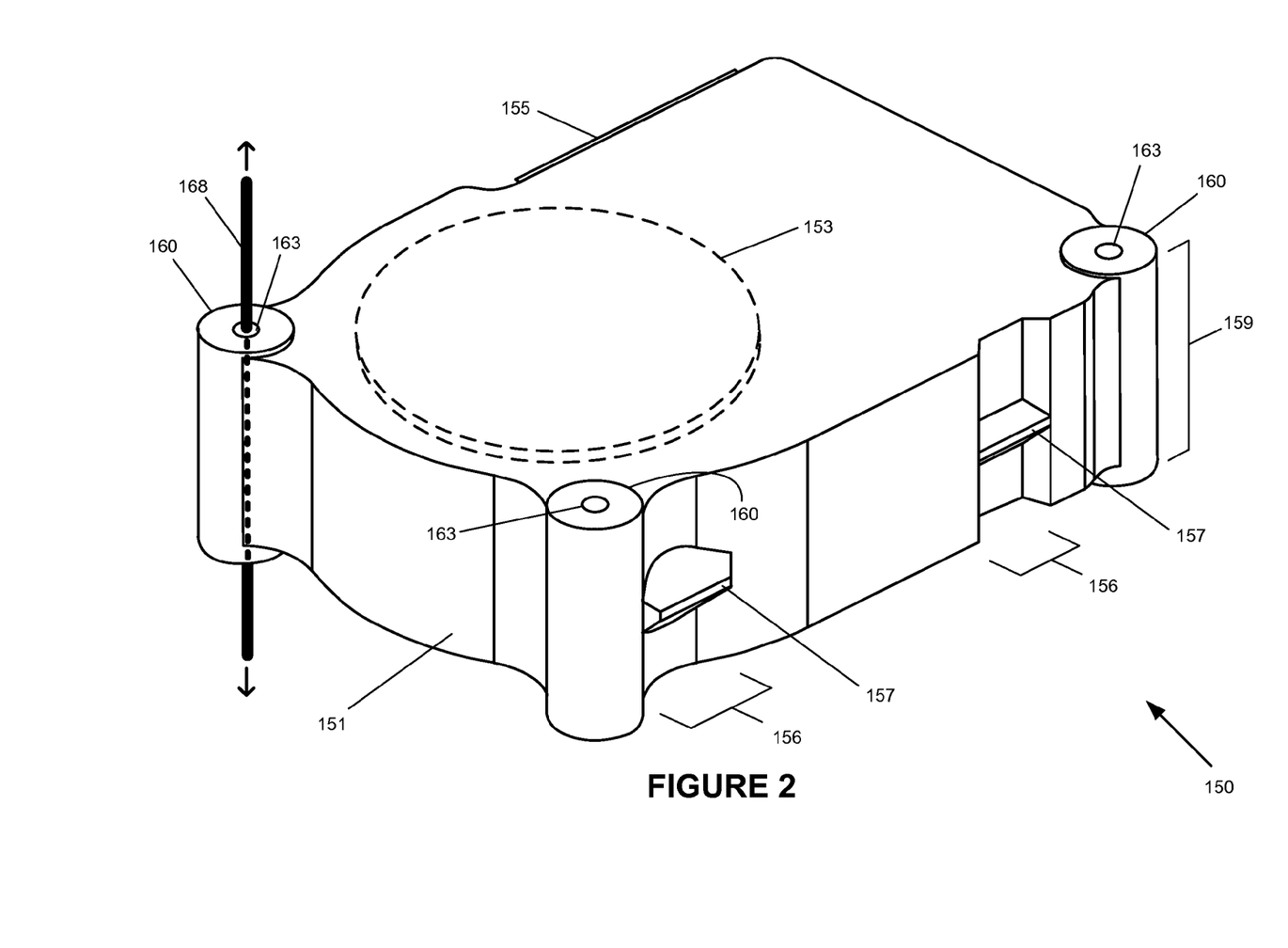
FIG. 2 shows a bottom surface of the storage drive.

In FIG. 5 an example joining rod 168 is illustrated as penetrating the mounting elements 160 of each storage drive 150 though the associated fastener bores 163. Joining rod 168 can have fastener elements 166 applied to each end to join each storage drive 150 into a storage drive block. For example, when a threaded rod or rod with threaded ends is employed, then one or more nuts can be employed on ends of rod 168 to join the storage drives together. An individual rod can be employed for each of the sets of substantially aligned fastener bores. FIG. 2 also shows rod 168 in relation to a single drive 150, and further storage drives 150 can be slid onto rod 168 to form a storage drive block. Additionally, rod 168 can be configured to extend past any associated nut or end fastener, such as shown by extension 162 in FIG. 5. This extension 162 can be employed for one or more of the rods used to join the storage drives 150 together and can rest or mate to mounts that can support the storage drive block. This rest or mate, not shown in FIG. 5 for clarity, can include vibration or shock dampening features as well as mechanical mounting features to hold the storage drive block in an enclosure.

The one or more mounting elements 160 in one example comprise two or more mounting elements 160 formed as part of the storage drive body 151. The one or more mounting elements 160 in another example comprise three or more mounting elements 160 formed as part of the storage drive body 151. Alternatively, the one or more mounting elements 160 could comprise four (or more) mounting elements 160, such as with one mounting element 160 at each corner of the storage drive body 151. It should be understood that any desired number of mounting elements 160 can be employed, as long as the number and location of mounting elements of a storage drive 150 operate to form a rigid and substantially stable storage drive block 100.

The one or more mounting elements 160 in the example in the figure comprise three mounting elements 160 located substantially on ends of the storage drive body 151. Two mounting elements 160 are located on the right end of the storage drive body 151 in the figure, adjacent to the one or more disk storage media 153, where a greater amount of vibration is expected to occur. The third mounting element 160 is shown at an opposite corner.

Advantageously, the design of the storage drive 150 requires fewer parts and provides an increased density by decreasing space between storage drives. Also, the design of the storage drive 150 reduces outside vibration by mounting a block of drives, allowing better mounting optimization. The design of the storage drive 150 can also provide better heat dissipation by employing thermally conductive paths between storage drives, as well as increase the thermal mass of a single drive when combined into a storage drive block.

FIG. 2 shows a bottom surface 159 of the storage drive 150. The storage drive 150 in some examples is configured to stand up on the bottom surface 159. The storage drive 150 in this example includes at least two shock mount channels 156 formed in the bottom surface 159. One or more shock mount elements 157 are located on the bottom surface 159 of the storage drive body 151 and are configured to substantially mate with a corresponding chassis tray shock mount element 110 located on a chassis tray of a mass storage chassis assembly (see FIG. 7). One or more shock mount elements 157 are located in each shock mount channel 156. The one or more shock mount elements 157 are formed of a shock-absorbing material in some examples.

The shock-absorbing material comprises an at least partially elastomeric material in some examples. The one or more shock mount elements 157 can be affixed to the storage drive body 151 in some examples, such as by welding, soldering, or use of bonding agents, can be trapped against the bottom surface 159 when the storage drive 150 is mounted in position, or can be held by retainer features such as grooves, rails, pins, or other retainer devices or retainer methods. Alternatively, in other examples the shock mount elements 157 are formed as part of the storage drive body 151, comprising the same material as the storage drive body 151. The one or more shock mount elements 157 comprise a tapered or wedge shape that fits to corresponding tapered groove formed between dual shock mount ridges 116 (see FIG. 6) of a chassis tray shock mount element 110. The chassis tray shock mount element or elements 110 are formed on or affixed to a chassis tray 55 configured to receive a storage drive block or blocks 100. In alternate examples, elements 157 are coupled to the chassis tray, while corresponding shock mount elements 110 are coupled to each storage drive 150.

Figure 3:
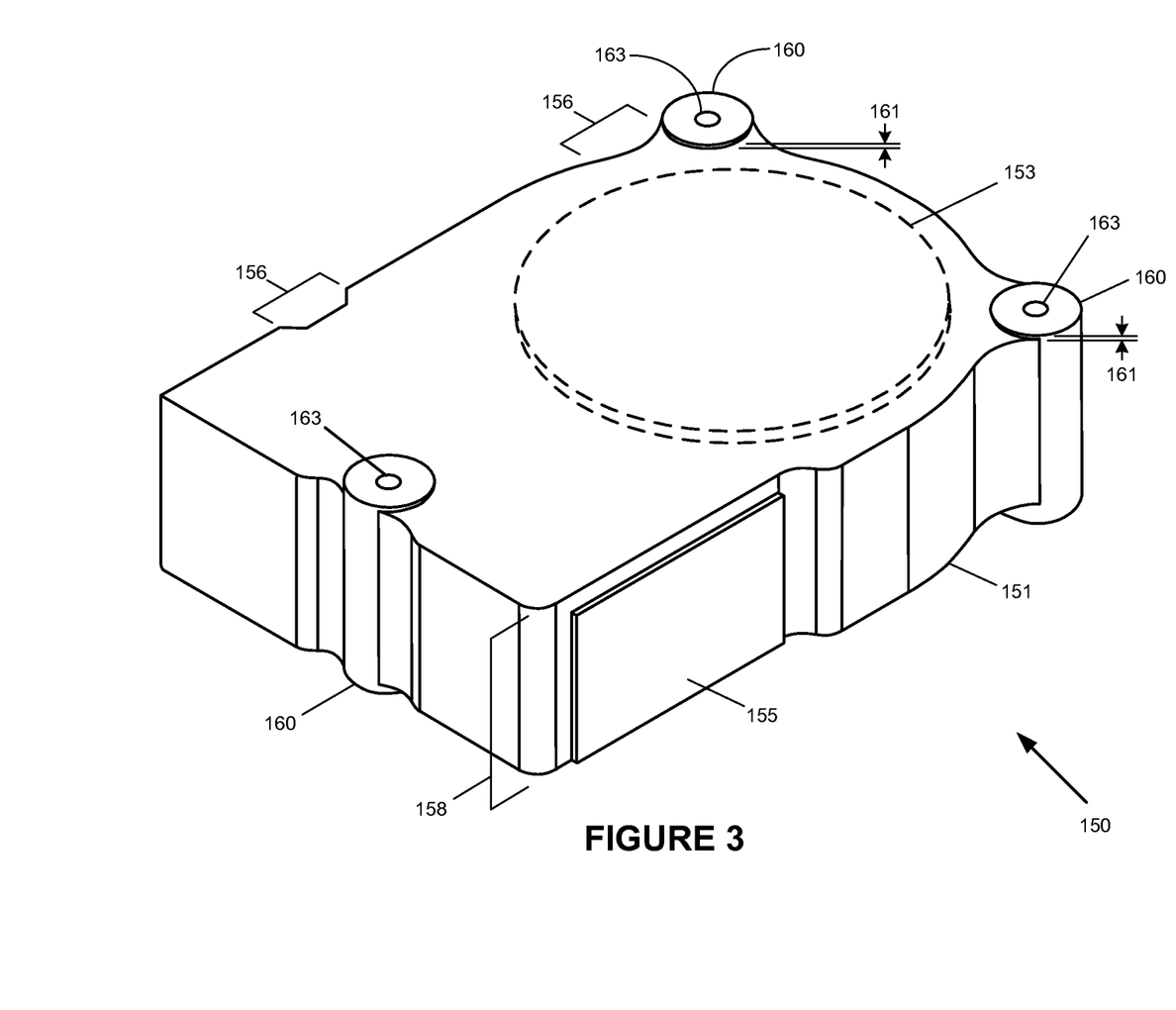
FIG. 3 shows the storage drive including an alternative arrangement of mounting elements.

FIG. 3 shows the storage drive 150 including an alternative arrangement of mounting elements 160. In this example, the storage drive 150 includes two mounting elements 160 at the disk storage media end and a single mounting element 160 at substantially a middle of an opposite end. It should be understood that this example is given merely to show that the location of individual mounting elements 160 can vary. However, a basic criteria of mounting element location is that the mounting elements 160 be spaced as far apart as is practical and be spaced-apart to provide a substantial or maximum stability in an assembled storage drive block 100. As a result, an individual storage drive 150 cannot vibrate or move independently with respect to the storage drive block 100.

FIG. 4 shows a storage drive block 100 comprising two or more storage devices 150. As previously discussed, each storage device 150 includes one or more mounting elements 160. When a storage drive block 100 is being formed, the mounting elements 160 of the constituent storage devices 150 are substantially aligned and brought into contact with adjacent storage devices 150 in the example shown. Each mounting element extends beyond a storage device body 151 by the predetermined clearance distance 161 in some examples. When two storage devices 150 are assembled together, the one or more mounting elements 160 of each storage device 150 come into contact and are joined by the joining elements 167 (or do not contact each other and are joined by joining elements 167). However, the storage device bodies 151 might not come into contact and instead any desired clearance distances 161 are added together to form a predetermined spacing gap 169 between the adjacent storage device bodies 151. A cooling airflow can be drawn through the spacing gap or gaps 169 in a storage drive block 100.

Alternatively, in other examples, spacers 167 are contacted by adjacent mounting elements 160, or a gap exists between adjacent one or more mounting elements 160, wherein the gaps are filled by joining elements 167. In an example using spacers 167, the predetermined spacing gaps 169 are dependent on, or set by, the thickness of the spacers 167, in combination with the clearance distances 161 of the mounting elements 160.

The various storage drives 150 in FIG. 4 can be joined using rods that penetrate each mounting element 160 and are fastened together using the rod, such as rod 168 of FIG. 5. In other examples, each storage drives 150 of FIG. 4 are soldered, welded, or otherwise bonded together to form storage drive block 100. In yet further examples, each mounting element 160 couples individually to an adjacent mounting element 160 of another storage drive, such as with keyed features, mating surfaces, locking features, among other coupling types.

FIG. 5 shows a storage drive block 100 for use in a mass storage chassis assembly 50. The storage drive block 100 comprises a plurality of storage drives 150 joined together into a substantially rigid storage drive block 100, a block communication element 53 (see FIG. 8) extending between individual storage drives of the plurality of storage drives 150 and communicatively linking a plurality of communication boards 155 of the plurality of storage drives 150 and adapted to communicatively link the plurality of storage drives 150 to a mass storage chassis assembly 50, and one or more joining elements 167 affixing the one or more mounting elements 160 of each storage drive 150 to form the storage drive block 100.

The storage drive block 100 comprises a substantially rigid block that absorbs vibrations generated by an operating storage drive or drives 150 of the storage drive block 100. The storage drive block 100 has a combined mass that absorbs vibrations generated by an operating storage drive or drives 150 of the storage drive block 100.

The storage drive block 100 in the example comprises seven storage drives 150 assembled into the storage drive block 100. The storage drive block 100 has sufficient rigidity and mass to absorb vibrations generated by an operating storage drive or drives 150 of the storage drive block 100.

The storage drives 150 in this example include three mounting elements 160 that form three substantially parallel and continuous members extending substantially the length of the storage drive block 100. The three substantially parallel and continuous members formed by the aligned mounting elements 160 include fastener bores 163 that are substantially aligned in this example. Three joining elements comprising three fastener elements 166 extend through the substantially aligned fastener bores 163 of the mounting elements 160. The fastener elements 166 in the example shown in FIG. 5 comprise threaded rods and nuts that operate to clamp together the aligned mounting elements to form the storage drive block 100.

Figure 6:
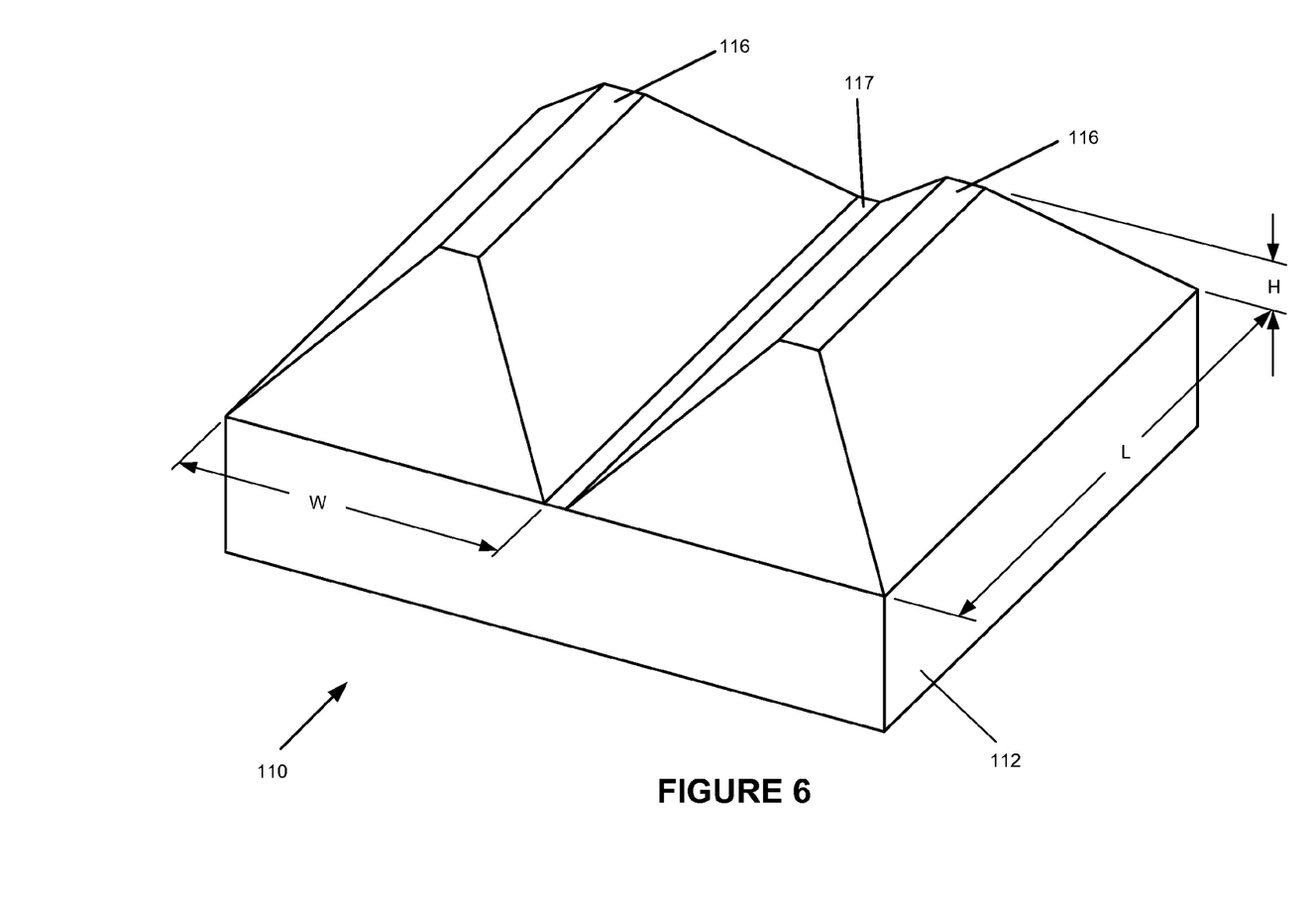
FIG. 6 shows an exemplary chassis tray shock mount element for receiving and isolating a storage drive of a storage drive block.

FIG. 6 shows an exemplary chassis tray shock mount element 110 for receiving and isolating a storage drive 150 of a storage drive block 100. The chassis tray shock mount element 110 comprises a shock mount body 112 and dual shock mount ridges 116 extending upward from the shock mount body 112. The shock mount body 112 is substantially rectangular in the embodiment shown. The dual shock mount ridges 116 in the example shown have substantially flat (or truncated) tips and include a height H, a width W, and a length L. The height H, the width W, and the length L are configured to fit into a shock mount channel 156 in the bottom surface 159 of a storage drive 150. The height H, the width W, and the length L are configured to fit over a shock mount element 157 extending from the bottom surface 159 of the storage drive 150. The dual shock mount ridges 116 are separated by a valley 117 in some examples, with the valley 117 in the example shown comprising a substantially flat region of the shock mount body 112 in some examples.

The chassis tray shock mount element 110 is formed of a shock-absorbing material in some examples. The shock-absorbing material comprises an at least partially elastomeric material in some examples.

Figure 7:
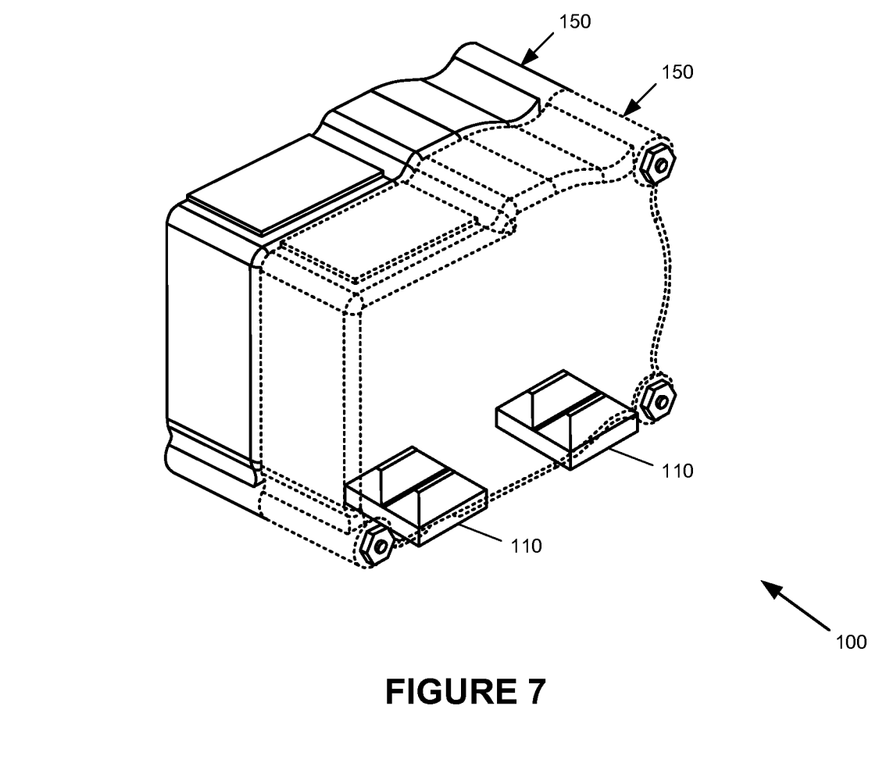
FIG. 7 shows a storage drive block including a storage drive resting on one or more shock mount elements.

FIG. 7 shows a storage drive block 100 including a storage drive 150 resting on one or more chassis tray shock mount elements 110. The chassis tray shock mount elements 110 are positioned on a chassis tray 55 of a mass storage chassis assembly 50. The chassis tray shock mount elements 110 are permanently or removably affixed to the chassis tray 55 in some examples (see FIG. 8). Alternatively, the chassis tray shock mount elements 110 are held in position on the chassis tray 55 by suitable shapes or devices. The chassis tray shock mount elements 110 are configured to fit to the one or more shock mount elements 157 of the storage drive 150. The chassis tray shock mount elements 110 comprise shock absorbing elements that support a storage drive 150. The chassis tray shock mount elements 110 in some examples have a complementary shape to the one or more shock mount elements 157 of the storage drive 150.

The chassis tray shock mount elements 110 hold a corresponding storage drive 150 substantially in place. The chassis tray shock mount elements 110 hold the corresponding storage drive 150 substantially in place while absorbing shocks and vibrations. The chassis tray shock mount elements 110 absorb shocks and vibrations of the corresponding storage drive 150. The chassis tray shock mount elements 110 absorb at least a portion of the shocks and vibrations of the storage drive block 100.

Figure 8:
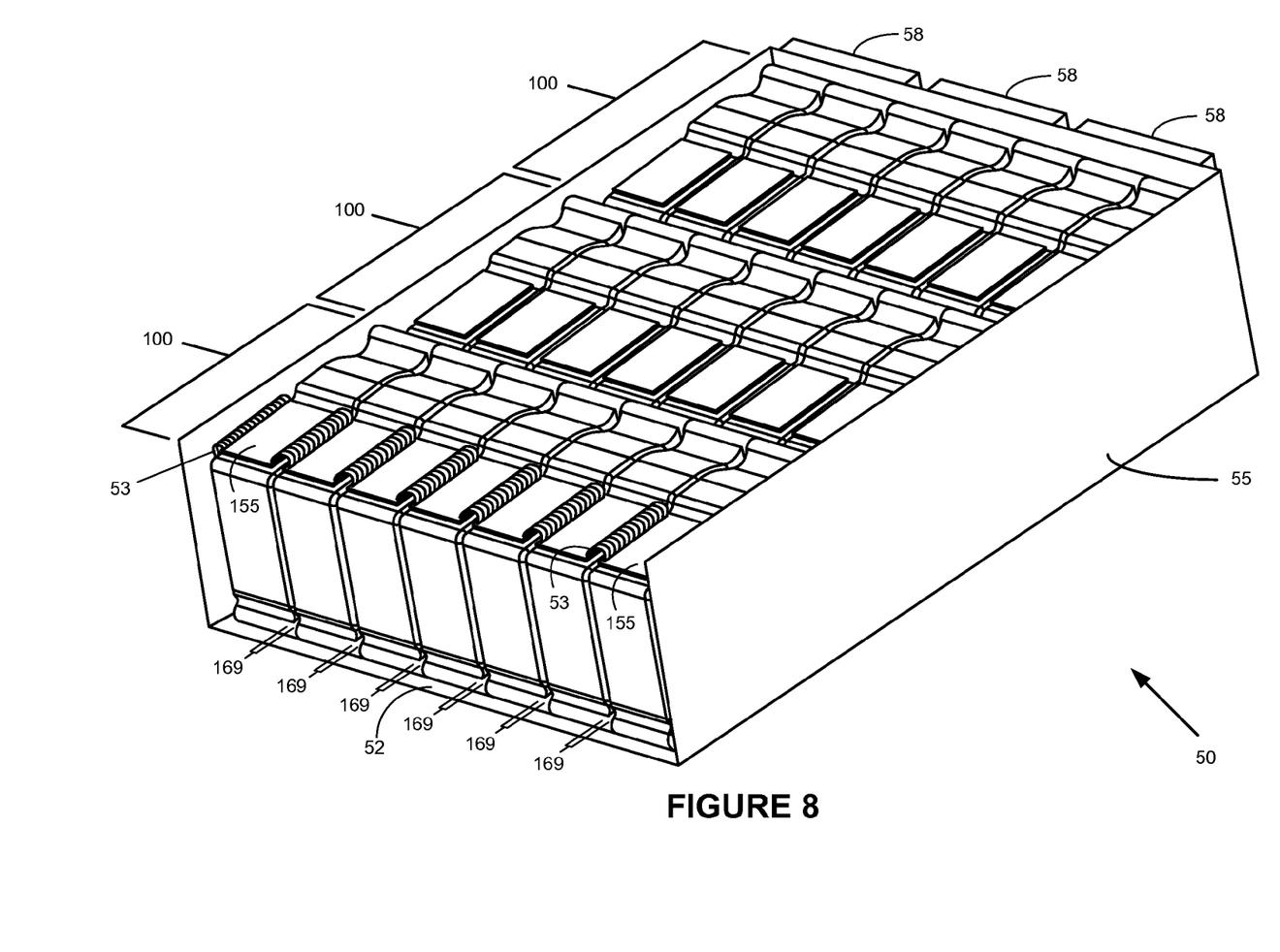
FIG. 8 shows an exemplary mass storage chassis assembly comprising three storage drive blocks.

FIG. 8 shows an exemplary mass storage chassis assembly 50 comprising three storage drive blocks 100. The mass storage chassis assembly 50 comprises a mass storage component configured to be installed into a rack or other structure of a digital data mass storage facility. A large increment of digital mass storage can be added to a digital storage facility by adding a mass storage chassis assembly 50. The mass storage chassis assembly 50 in some examples comprises a cold storage mass storage chassis assembly 50. The cold storage mass storage chassis assembly 50 stores digital data that is infrequently accessed. In the cold storage mass storage chassis assembly 50, only a small percentage of the storage drives 150 may be operating at any given time.

The mass storage chassis assembly 50 comprises a chassis tray 55 receiving a plurality of storage drive blocks 100. The mass storage chassis assembly 50 can be configured to receive any desired number of storage drive blocks 100. Each storage drive block 100 can be received on and rests on a plurality of shock mount elements 110 affixed to the bottom of the chassis tray 55. One or more fan units 58 are affixed to or form part of a rear wall of the chassis tray 55. The one or more fan units 58 draw airflow through the plurality of storage drive blocks 100. In some examples, a lid or top cover (not shown) can be affixed to the top of the chassis tray 55 to ensure that airflow is drawn around and through the plurality of storage drive blocks 100, from front to back. The one or more fan units 58 draw airflow though the spacing gaps 169 in each storage drive block 100.

The mass storage chassis assembly 50 further includes a plurality of block communication elements 53. In some examples, a block communication element 53 is coupled to each storage drive block 100 and couples each communication board 155 of each storage drive 150 in the storage drive block 100. A block communication element 53 is shown for only the front storage drive block 100 in the example, but it should be understood that each storage drive block 100 includes a block communication element 53 in a complete mass storage chassis assembly 50. The block communication element 53 is further coupled to each communication board 155 of the storage drive block 100 by block communication elements 53 extending between adjacent storage drives 150 of the storage drive block 100. The plurality of block communication elements 53 are further coupled to a chassis I/O interface (not shown) located at a front region 52 of the chassis tray 55. The chassis I/O interface includes a chassis I/O connector (not shown) that functions to exchange electrical signals and digital data between the mass storage chassis assembly 50 and one or more external devices or systems. The chassis I/O interface further provides electrical power to and operates the one or more fan units 58 mounted at the rear of the chassis tray 55. As a result, any or all of the storage drives 150 of the storage drive block 100 can be accessed and operated. Alternatively, in other examples, individual wires, cables, or other conductors individually connect each storage drive 150 to a chassis I/O interface.

While the present invention has been particularly shown and described with reference to the preferred implementations, it will be understood by those skilled in the art that various changes in form and detail may be made without departing from the spirit and scope of the invention. Accordingly, the disclosed invention is to be considered merely as illustrative and limited in scope only as specified in the claims.

What is claimed is:

1. A storage drive block adapted for use in a mass storage chassis assembly, the storage drive block comprising:
   a plurality of storage drives joined together into a substantially rigid storage drive block, wherein a storage drive of the plurality of storage drives comprises:
      a storage drive body;
      one or more disk storage media within the storage drive body;
      one or more shock mount elements located on a first surface of the storage drive body and configured to substantially mate with a corresponding chassis tray shock mount element located on a chassis tray of a mass storage chassis assembly; and
      a communication board located on a second surface of the storage drive body opposite the first surface and configured to communicate digital data to and from the storage drive; and
   one or more joining elements that couple one or more mounting elements of each storage drive to form the storage drive block.

2. The storage drive block of claim 1, wherein:
   the one or more mounting elements couple the storage drive to adjacent storage drives of the plurality of storage drives; and
   the one or more mounting elements extend from the storage drive body by a predetermined clearance distance to establish predetermined spacing gaps between the plurality of storage drives.

3. The storage drive block of claim 2, wherein a predetermined spacing gap is formed between adjacent storage drives of the plurality of storage drives due to the predetermined clearance distances of the one or more mounting elements.

4. The storage drive block of claim 1, wherein the one or more shock mount elements comprise:
   a shock mount body; and
   a plurality of shock mount ridges extending away from the shock mount body.

5. The storage drive block of claim 1, wherein:
   the one or more mounting elements include fastener bores; and
   the one or more joining elements comprise fastener elements extending through substantially aligned fastener bores.

6. The storage drive block of claim 1, wherein the one or more joining elements comprise at least one of weld joints, solder joints, and bonding agent joints between adjacent storage drives of the plurality of storage drives.

7. The storage drive block of claim 1, wherein the one or more mounting elements comprise two or more mounting elements formed as part of the storage drive body.

8. The storage drive block of claim 1, wherein the one or more mounting elements comprise three or more mounting elements formed as part of the storage drive body.

9. A mass storage chassis assembly, comprising:
   a chassis tray configured to receive a plurality of storage drive blocks;
   one or more sets of shock mount elements located on a surface of the chassis tray; and
   one or more storage drive blocks received in the chassis tray and received on the one or more sets of shock mount elements, wherein the one or more sets of shock mount elements isolate the one or more storage drive blocks from the chassis tray, and wherein a storage drive block of the one or more storage drive blocks comprises:
      a plurality of storage drives joined together into a substantially rigid storage drive block, wherein an individual storage drive of the plurality of storage drives comprises:
         a storage drive body;
         one or more disk storage media within the storage drive body;
         one or more mounting elements joined to the storage drive body to couple the storage drive to adjacent storage drives of the plurality of storage drives, the one or more mounting elements extending from the storage drive body by a predetermined clearance distance to establish predetermined spacing gaps between the plurality of storage drives; and
         a communication board available on an exterior of the storage drive body and configured to communicate digital data to and from the individual storage drive; and
      one or more joining elements coupling the plurality of storage drives together to form the storage drive block.

10. The mass storage chassis assembly of claim 9, wherein the individual storage drive further comprises one or more shock mount elements located on a surface of the storage drive body and configured to substantially mate with a corresponding chassis tray shock mount element located on the chassis tray of the mass storage chassis assembly.

11. The mass storage chassis assembly of claim 9, wherein:
    the one or more mounting elements include fastener bores; and
    the one or more joining elements comprise fastener elements extending through substantially aligned fastener bores.

12. The mass storage chassis assembly of claim 9, wherein the one or more joining elements comprise at least one of weld joints, solder joints, and bonding agent joints between adjacent storage drives of the plurality of storage drives.

13. The mass storage chassis assembly of claim 9, wherein a predetermined spacing gap is formed between adjacent storage drives of the plurality of storage drives due to the predetermined clearance distances of the one or more mounting elements.

14. The mass storage chassis assembly of claim 9, further comprising one or more spacers configured to be positioned against the corresponding one or more mounting elements of the individual storage drive.

15. A storage drive configured for use in a storage drive block, comprising:
    a storage drive body;
    one or more disk storage media within the storage drive body;
    one or more mounting elements to couple the storage drive to one or more further storage drives, the one or more mounting elements configured to establish a predetermined spacing gap between the storage drive and the one or more further storage drives;
    one or more shock mount elements located on a first surface of the storage drive body and configured to substantially mate with a corresponding shock mount element located on a surface of a chassis tray of a mass storage chassis assembly; and
    a communication board located on a second surface of the storage drive body opposite the first surface and configured to communicate digital data to and from the storage drive.

16. The storage drive of claim 15, wherein the one or more mounting elements include fastener bores, and further comprising one or more joining elements comprising fastener elements extending through substantially aligned fastener bores.

17. The storage drive of claim 16, wherein the one or more joining elements comprise at least one of weld joints, solder joints, and bonding agent joints.

* * * * *